US012666630B2

(12) United States Patent
Arimura et al.

(10) Patent No.: US 12,666,630 B2
(45) Date of Patent: Jun. 23, 2026

(54) SEMICONDUCTOR DEVICE

(71) Applicant: ROHM CO., LTD., Kyoto (JP)

(72) Inventors: Masahiko Arimura, Kyoto (JP); Daiki Yanagishima, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 391 days.

(21) Appl. No.: 18/447,832

(22) Filed: Aug. 10, 2023

(65) Prior Publication Data

US 2023/0387185 A1    Nov. 30, 2023

Related U.S. Application Data

(63) Continuation of application No. PCT/JP2022/006489, filed on Feb. 17, 2022.

(30) Foreign Application Priority Data

Feb. 17, 2021    (JP) ................................. 2021-023494

(51) Int. Cl.
  *H10D 86/85*        (2025.01)
  *H10D 1/47*         (2025.01)
        (Continued)
(52) U.S. Cl.
  CPC ........... *H10D 1/474* (2025.01); *H10D 84/204* (2025.01); *H10D 86/85* (2025.01); *H10W 90/00* (2026.01);
        (Continued)

(58) Field of Classification Search
  CPC ...... H10D 1/474; H10D 84/204; H10D 86/85; H10D 1/47; H01L 24/05; H01L 24/48; H01L 25/105; H01L 2224/05644; H01L 2224/48247; H01L 2225/1052; H01L 2924/19043; H01L 23/50; H01L 25/16;
        (Continued)

(56) References Cited

U.S. PATENT DOCUMENTS 6,353,353 B1    3/2002  Nakayama
2003/0075732 A1    4/2003  Franke et al.
        (Continued)

FOREIGN PATENT DOCUMENTS

CN    211479791 U    9/2020
JP    H10200051 A    7/1998
        (Continued)

OTHER PUBLICATIONS

Office Action issued for German Patent Application No. 11 2022 000 635.8, dated Oct. 26, 2023, 13 pages including English machine translation.
        (Continued)

*Primary Examiner* — Elias Ullah
(74) *Attorney, Agent, or Firm* — HSML P.C.

(57)    ABSTRACT

This semiconductor device is provided with: a high-voltage die pad and a low-voltage die pad, which are insulated from each other; a resistive element which is mounted on the high-voltage die pad; and a semiconductor element which is mounted on the low-voltage die pad. The resistive element is provided with: a substrate which is mounted on the high-voltage die pad; an insulating layer which is formed on the substrate; and a thin film resistive layer which is formed on the insulating layer.

18 Claims, 10 Drawing Sheets

(51) Int. Cl.
H10D 84/00 (2025.01)
H10W 90/00 (2026.01)
*H10W 72/90* (2026.01)

(52) U.S. Cl.
CPC ........ *H10W 72/952* (2026.01); *H10W 90/752*
(2026.01); *H10W 90/756* (2026.01)

(58) Field of Classification Search
CPC . H01C 1/02; H01C 1/14; H01C 1/032; H01C
7/006
See application file for complete search history.

(56) References Cited

U.S. PATENT DOCUMENTS

| | | | |
|---|---|---|---|
| 2008/0003759 A1* | 1/2008 | Chinthakindi | H10D 1/68 |
| | | | 257/E23.142 |
| 2016/0211200 A1 | 7/2016 | Ohashi et al. | |

FOREIGN PATENT DOCUMENTS

| | | |
|---|---|---|
| JP | 2010008227 A | 1/2010 |
| JP | 2017079254 A | 4/2017 |

OTHER PUBLICATIONS

International Search Report issued for International Patent Application No. PCT/JP2022/006489, Date of mailing: May 17, 2022, 5 pages including English translation.

Written Opinion issued for International Patent Application No. PCT/JP2022/006489, Date of mailing: May 17, 2022, 10 pages including English translation.

Notice of Reasons for Refusal issued for Japanese Patent Application No. 2023-500932, Dispatch date: Jan. 27, 2026, 8 pages including English machine translation.

* cited by examiner

SEMICONDUCTOR DEVICE

BACKGROUND

The present disclosure relates to a semiconductor device.

A known device uses a resistor voltage divider to detect high voltage. JP 2010-8227 A discloses an example of a power supply device that detects voltages at battery units with a voltage detection circuit including a resistor ladder and an A/D converter. The resistor ladder includes series resistors, connected in series to one another, and voltage dividing resistors, connecting voltage dividing points of the series resistors to connection points of high-voltage batteries.

DETAILED DESCRIPTION

Embodiments of a semiconductor device will now be described with reference to the drawings. The embodiments described below exemplify configurations and methods for embodying a technical concept without any intention to limit the material, shape, structure, arrangement, dimensions, and the like of each component.

One embodiment of a semiconductor device 10 will now be described with reference to FIGS. 1 to 5.

The semiconductor device 10 of the present embodiment is a high-voltage monitor having a high withstand voltage. The semiconductor device 10 has a rated voltage of 1200 V. In one example, the semiconductor device 10 is used as a high-voltage monitor that monitors the battery voltage of an electric vehicle or a hybrid electric vehicle. The semiconductor device 10 may have any rated voltage.

Figure 1:
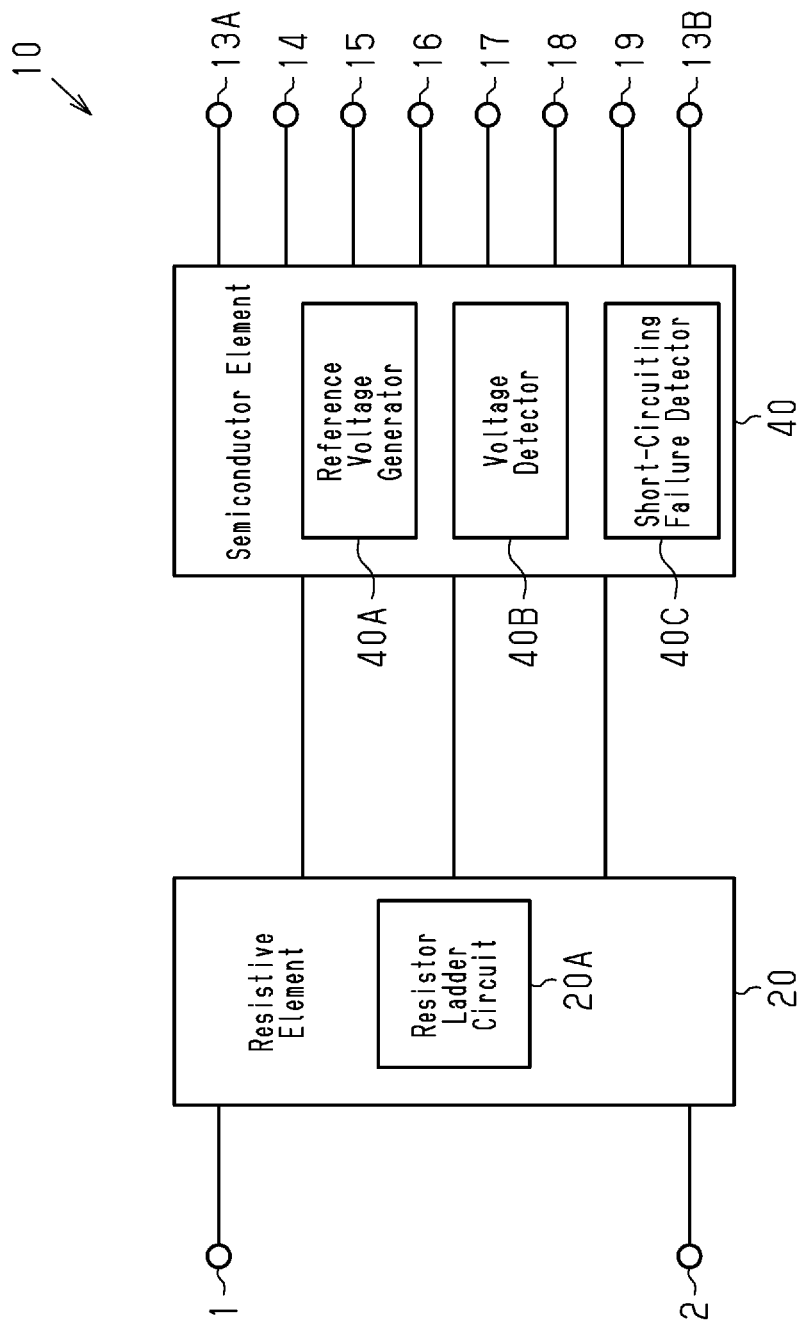
FIG. 1 is a block diagram schematically showing the circuit configuration of one embodiment of a semiconductor device.

As shown in FIG. 1, the semiconductor device 10 includes input terminals 11 and 12, output terminals 13A, 13B, and 14 to 19, a resistive element 20, and a semiconductor element 40.

The input terminals 11 and 12 are electrically connected to a measured subject of the semiconductor device 10. The measured subject is the subject of which the voltage is measured by the semiconductor device 10. For example, the input terminal 11 is connected to the positive terminal of a battery, and the input terminal 12 is connected to the negative terminal of the battery. A voltage of, for example, 1200 V is applied between he input terminal 11 and the input terminal 12. The input terminals 11 and 12 are electrically connected to the resistive element 20. In the present embodiment, the input terminal 11 corresponds to a first input terminal, and the input terminal 12 corresponds to a second input terminal.

The resistive element 20 includes a resistor ladder circuit 20A in which resistors are electrically connected in series. The input terminal 11 is electrically connected to one of the resistors located at the two ends of the series-connected resistors, and the input terminal 12 is connected to the other one of the resistors located at the two ends. Thus, a voltage of, for example, 1200 V is applied to the resistive element 20 by the input terminals 11 and 12.

Figure 2:
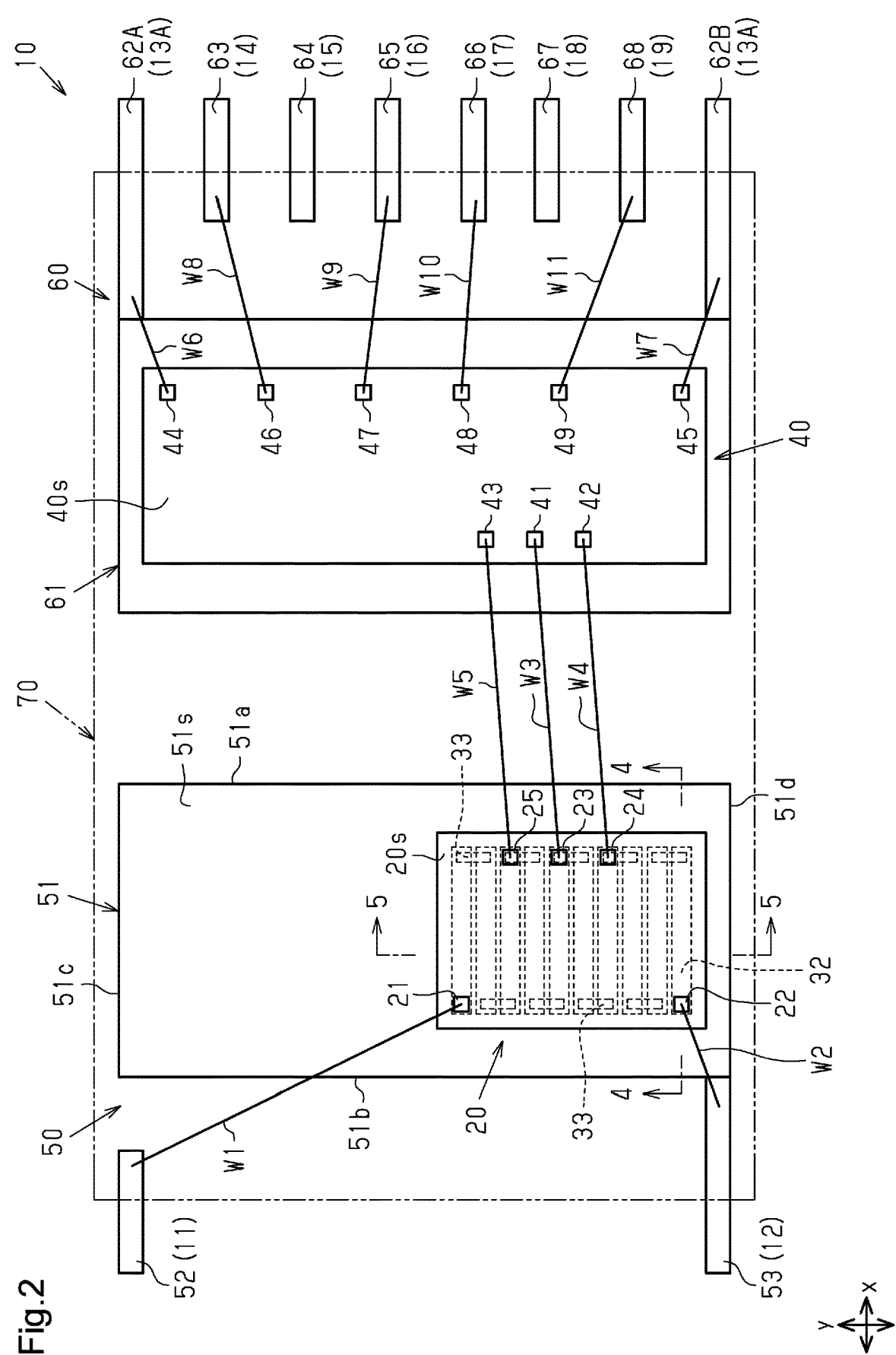
FIG. 2 is a plan view showing the internal structure of the semiconductor device.

As shown in FIG. 2, the resistive element 20 includes a reference electrode 23 between the first input terminal 11 and the second input terminal 12, a first detection electrode 24 between the reference electrode 23 and the second input terminal 12, and a second detection electrode 25 between the reference electrode 23 and the first input terminal 11. Each of the reference electrode 23, the first detection electrode 24, and the second detection electrode 25 outputs a divisional voltage from the resistive element 20 and is electrically connected to the semiconductor element 40. The divisional voltages output from the resistive element 20 include a reference voltage, a first voltage lower than the reference voltage, and a second voltage higher than the reference voltage. The first detection electrode 24 outputs the first voltage, and the second detection electrode 25 outputs the second voltage.

As shown in FIG. 1, the semiconductor element 40 uses the potential divided by the resistive element 20 for voltage measurement. The semiconductor element 40 is electrically connected to the output terminals 13A, 13B, and 14 to 19. The semiconductor element 40 includes, for example, operational amplifiers. The output terminals 13A and 13B act as ground terminals. Drive voltage is supplied to the semiconductor element 40 with one of the output terminals 14 to 19 to drive an operational amplifier included in the semiconductor element 40.

As shown in FIGS. 1 and 2, the semiconductor element 40 includes a reference voltage generator 40A that generates the reference voltage, a voltage detector 40B that uses the first voltage of the first detection electrode 24 and the second voltage of the second detection electrode 25 to detect the voltage applied to the input terminals 11 and 12, and a short-circuiting failure detector 40C that uses one of the output terminals 14 to 19 to send the first voltage and the second voltage out of the semiconductor device 10. An integrated circuit (not shown) electrically connected to the semiconductor element 40 detects a short-circuiting failure with the first voltage and the second voltage from the short-circuiting failure detector 40C.

As shown in FIG. 2, the semiconductor device 10 includes a high-voltage lead frame 50, a low-voltage lead frame 60, and an encapsulation resin 70. The two lead frames 50 and include copper (Cu). The encapsulation resin 70 includes an electrically insulative material, in the present embodiment, a black epoxy resin. In FIG. 2, the encapsulation resin 70 is indicated by the double-dashed lines to illustrate the internal structure of the semiconductor device 10.

The high-voltage lead frame 50 and the low-voltage lead frame 60 are disposed separated from each other. In the description hereafter, the direction in which the lead frames 50 and 60 are arranged is referred to as the x-direction, the thickness direction of the two lead frames 50 and 60 is referred to as the z-direction, and the direction orthogonal to the x-direction and the z-direction is referred to as the y-direction.

The high-voltage lead frame 50 includes a high-voltage die pad 51 and two high-voltage leads 52 and 53. The high-voltage lead 52 forms the input terminal 11 of FIG. 1, and the high-voltage lead 53 forms the input terminal 12 of FIG. 1. In the present embodiment, the high-voltage die pad 51 corresponds to a first conductive layer, the high-voltage lead 52 corresponds to a first input terminal, and the high-voltage lead 53 corresponds to a second input terminal.

The high-voltage die pad 51 is disposed in the encapsulation resin 70. As viewed in the z-direction, the high-voltage die pad 51 has the shape of a rectangle, of which the short sides extend in the x-direction and the long sides extend in the y-direction. The high-voltage die pad 51 includes a main surface 51s and a back surface 51r (refer to FIG. 4), facing opposite directions in the z-direction, and side surfaces 51a to 51d, orthogonal to both of the main surface 51s and the back surface 51r. The side surfaces 51a and 51b form the two end surfaces of the high-voltage die pad 51 in the x-direction, and the side surfaces 51c and 51d form the two end surfaces of the high-voltage die pad 51 in the y-direction. The side surface 51a is the side surface of the high-voltage die pad 51 that is close to the low-voltage lead frame 60, and the side surface 51b is the side surface of the high-voltage die pad 51 that is far from the low-voltage lead frame 60.

The high-voltage leads 52 and 53 are located at the side of the high-voltage die pad 51 opposite to the low-voltage lead frame 60 in the x-direction. The high-voltage leads 52 and 53 extend from the inside to the outside of the encapsulation resin 70. The high-voltage leads 52 and 53 are disposed at the two ends of the high-voltage die pad 51 in the y-direction. As viewed in the z-direction, the high-voltage lead 52 is disposed separated in the x-direction from the one of the two ends of the high-voltage die pad 51 in the y-direction that is closer to the side surface 51c. As viewed in the z-direction, the high-voltage lead 53 is disposed on the one of the two ends of the high-voltage die pad 51 in the y-direction that is closer to the side surface 51d. In this manner, the y-direction is the arrangement direction of the high-voltage leads 52 and 53. The high-voltage lead 53 is integrated with the high-voltage die pad 51. As viewed in the z-direction, the high-voltage leads 52 and 53 are belt-shaped and extend in the x-direction. The distance between the high-voltage lead 52 and the high-voltage die pad 51 is set so that the dielectric withstand voltage between the high-voltage lead 52 and the high-voltage die pad 51 will be approximately 1200 V.

The high-voltage lead 52 is disposed separated from the high-voltage die pad 51, and the encapsulation resin 70 between the high-voltage lead 52 and the high-voltage lead 53 insulates the high-voltage lead 52 from the high-voltage lead 53 in the y-direction. The distance between the high-voltage lead 52 and the high-voltage lead 53, which project out of the encapsulation resin 70, is set so that the dielectric withstand voltage between the high-voltage lead 52 and the high-voltage lead 53 will be approximately 1200 V.

The low-voltage lead frame 60 includes a low-voltage die pad 61 and eight low-voltage leads 62A, 62B, and 63 to 68. The high-voltage leads are less in number than the low-voltage leads. The low-voltage leads 62A and 62B form the output terminals 13A and 13B, and the low-voltage leads 64 to 68 form the output terminals 14 to 19. In the present embodiment, the low-voltage die pad 61 corresponds to a second conductive layer, and the low-voltage leads 62A, 62B, and 63 to 68 correspond to three or more output terminals electrically connected to a semiconductor element.

The low-voltage die pad 61 is disposed in the encapsulation resin 70. As viewed in the z-direction, the low-voltage die pad 61 has the shape of a rectangle, of which the short sides extend in the x-direction and the long sides extend in the y-direction. In one example, the low-voltage die pad 61 may be equal in length in the x-direction to the high-voltage die pad 51, and the low-voltage die pad 61 may be equal in length in the y-direction to the high-voltage die pad 51. Thus, as viewed in the z-direction, the low-voltage die pad 61 may be equal in area to the high-voltage die pad 51.

The low-voltage die pad 61 is disposed separated from the high-voltage die pad 51 in the x-direction. Thus, the x-direction is the arrangement direction of the high-voltage die pad 51 and the low-voltage die pad 61. In the present embodiment, the x-direction corresponds to a first direction. The y-direction that is orthogonal to the x-direction corresponds to a second direction.

The encapsulation resin 70 extends between the high-voltage die pad 51 and the low-voltage die pad 61. The high-voltage die pad 51 is insulated from the low-voltage die pad 61. The distance between the high-voltage die pad 51 and the low-voltage die pad 61 is greater than the distance between the high-voltage lead 52 and the high-voltage die pad 51.

The low-voltage leads 62A, 62B, and 63 to 68 are located at the side of the low-voltage die pad 61 opposite to the high-voltage lead frame 50 in the x-direction. The low-voltage leads 62A, 62B, and 63 to 68 extend from the inside to the outside of the encapsulation resin 70. The low-voltage leads 62A, 62B, and 63 to 68 are located at the same position in the x-direction and separated from one another in the y-direction. Thus, the y-direction is the arrangement direction of the low-voltage leads 62A, 62B, and 63 to 68. The low-voltage leads 62A, 63, 64, 65, 66, 67, 68, and 62B are arranged in this other in the y-direction. The low-voltage leads 62A and 62B, which are the two ones of the low-voltage leads 62A, 62B, and 63 to 68 located at the two ends in the y-direction, are integrated with the low-voltage die pad 61. The distance between adjacent ones of the low-voltage leads 62A, 62B, and 63 to 68 is less than the distance between the high-voltage leads 52 and 53. In other words, the distance between the high-voltage leads 52 and 53 in the y-direction is greater than the distance between adjacent ones of the low-voltage leads 62A, 62B, and 63 to 68 in the y-direction.

The resistive element 20 is mounted on the high-voltage die pad 51. In the present embodiment, the resistive element 20 is bonded by a conductive bonding material, such as solder or silver (Ag) paste, to the main surface 51s of the high-voltage die pad 51. The resistive element 20 is a single chip including a plurality of resistors.

As viewed in the z-direction, the resistive element 20 is located toward the high-voltage lead 53 on the high-voltage die pad 51 in the y-direction. In other words, as viewed in the z-direction, the resistive element 20 is located toward the side surface 51d on the high-voltage die pad 51 in the y-direction. The resistive element 20 is disposed, on the high-voltage die pad 51, so that its center in the y-direction is located closer to the high-voltage lead 53 in the y-direction than the center of the high-voltage die pad 51 in the y-direction.

Figure 4:
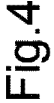
FIG. 4 is a cross-sectional view of the semiconductor device taken along line 4-4 in FIG. 2.
Figure 4:

The resistive element 20 includes an element head surface 20s and an element back surface 20r (refer to FIG. 4). The resistive element 20 is disposed so that the element head surface 20s faces the same direction as the main surface 51s of the high-voltage die pad 51. As viewed in the z-direction, the resistive element 20 has the shape of a rectangle, of which the short sides extend in the x-direction and the long sides extend in the y-direction. The resistive element 20 is mounted on the high-voltage die pad 51 so that the long sides extend in the y-direction and the short sides extend in the x-direction. In the present embodiment, the length of the resistive element 20 in the y-direction is ½ or less than the length of the high-voltage die pad 51 in the y-direction. In the present embodiment, the element head surface 20s of the resistive element 20 corresponds to a head surface of a resistive element.

The resistive element 20 includes electrodes formed on the element head surface 20s. The electrodes are formed on the element head surface 20s at separate positions. In the present embodiment, the electrodes include a first input electrode 21, a second input electrode 22, the reference electrode 23, the first detection electrode 24, and the second detection electrode 25. The first input electrode 21 is electrically connected to the high-voltage lead 52, and the second input electrode 22 is electrically connected to the high-voltage lead 53. The reference electrode 23, the first detection electrode 24, and the second detection electrode 25 are electrically connected to the semiconductor element 40. More specifically, the reference electrode 23, the first detection electrode 24, and the second detection electrode 25 are respectively configured to output the reference voltage, the first voltage, and the second voltage to the semiconductor element 40 as divisional voltages of the voltage between the first input electrode 21 and the second input electrode 22.

As viewed in the z-direction, the first input electrode 21 is formed on the one of the four corners of the element head surface 20s of the resistive element 20 that is near the side surface 51b and the side surface 51c of the high-voltage die pad 51. As viewed in the z-direction, the second input electrode 22 is formed on the one of the four corners of the element head surface 20s of the resistive element 20 that is near the side surface 51b and the side surface 51d of the high-voltage die pad 51. Thus, as viewed in the z-direction, the two input electrodes 21 and 22 are disposed on the one of the two ends of the element head surface 20s of the resistive element 20 in the x-direction that is closer to the high-voltage leads 52 and 53 and disposed in a separated manner on the two ends of the element head surface 20s in the y-direction.

As viewed in the z-direction, the reference electrode 23 is disposed on the one of the two ends of the element head surface 20s of the resistive element 20 in the x-direction that is closer to the side surface 51a of the high-voltage die pad 51 at a substantially middle part in the y-direction.

As viewed in the z-direction, the two detection electrodes 24 and 25 are disposed on the one of the two ends of the element head surface 20s of the resistive element 20 in the x-direction that is closer to the side surface 51a of the high-voltage die pad 51. As viewed in the z-direction, the first detection electrode 24 is disposed on the element head surface 20s of the resistive element 20 closer to the side surface 51d of the high-voltage die pad 51 than the reference electrode 23 in the y-direction. Further, as viewed in the z-direction, the first detection electrode 24 is disposed on the element head surface 20s closer to the reference electrode 23 than the first input electrode 21 in the y-direction. As viewed in the z-direction, the second detection electrode 25 is disposed on the element head surface 20s of the resistive element 20 closer to the side surface 51c of the high-voltage die pad 51 than the reference electrode 23 in the y-direction.

Further, the second detection electrode 25 is disposed on the element head surface 20s closer to the reference electrode 23 than the second input electrode 22 in the y-direction. As shown in FIG. 2, the electrodes 23 to 25 are located at the same position in the x-direction and separated from one another in the y-direction.

The resistive element 20 includes a thin-film resistive layer 32 that forms the resistive element 20. In the present embodiment, there is a plurality of thin-film resistive layers 32. The number of the thin-film resistive layers 32 is determined in accordance with the resistance required for the resistive element 20 and the resistance of each of the thin-film resistive layers 32. In one example, the number of the thin-film resistive layers 32 is determined so that the resistance of the resistive element 20 will be 20 MΩ or greater. In one example, the thin-film resistive layers 32 are greater in number than the electrodes formed on the element head surface 20s of the resistive element 20. The thin-film resistive layers 32 are disposed separated from one another in the y-direction. The thin-film resistive layers 32 are arranged in parallel in the y-direction.

Adjacent ones of the thin-film resistive layers 32 in the y-direction are connected to each other by a connection line 33. The connection line 33 includes a conductive material, for example, Cu.

The semiconductor element 40 is mounted on the low-voltage die pad 61. In the present embodiment, the semiconductor element 40 is bonded by a conductive bonding material to the low-voltage die pad 61. The semiconductor element 40 is a single chip including a plurality of operational amplifiers.

As viewed in the z-direction, the semiconductor element 40 has the shape of a rectangle, of which the short sides extend in the x-direction and the long sides extend in the y-direction. In the present embodiment, the semiconductor element 40 is greater in length in the y-direction than the resistive element 20. The semiconductor element 40 may have any size. For example, the length of the semiconductor element 40 in the y-direction may be less than or equal to the length of the resistive element 20 in the y-direction.

The semiconductor element 40 includes an element head surface 40s and an element back surface (not shown). The semiconductor element 40 is disposed on the low-voltage die pad 61 so that the element head surface 40s faces the same direction as the element head surface 20s of the resistive element 20.

The semiconductor element 40 includes electrodes formed on the element head surface 40s. The electrodes are formed on the element head surface 40s at separate positions. The electrodes include first to ninth electrodes 41 to 49. the first electrode 41, the second electrode 42, and the third electrode 43 are electrically connected to the reference electrode 23, the first detection electrode 24, and the second detection electrode 25 of the resistive element 20. The electrodes 44 to 49 are electrically connected to the low-voltage leads 62A, 62B, 63, 65, 66, and 68.

The two lead frames 50 and 60, the resistive element 20, and the semiconductor element 40 are connected by wires. In the present embodiment, the wires include first to eleventh wires W1 to W11. That is, the semiconductor device 10 includes the first to eleventh wires W1 to W11. The wires W1 to W11 include a conductive material such as gold (Au), Cu, or aluminum (Al), and are, for example, bonding wires formed by a wire bonding device.

The first wire W1 connects the first input electrode 21 of the resistive element 20 to the high-voltage lead 52, and the second wire W2 connects the second input electrode 22 of the resistive element 20 to the high-voltage lead 53.

The third wire W3 connects the reference electrode 23 of the resistive element 20 to the first electrode 41 of the semiconductor element 40. The fourth wire W4 connects the first detection electrode 24 of the resistive element 20 to the second electrode 42 of the semiconductor element 40. The fifth wire W5 connects the second detection electrode 25 of the resistive element 20 to the third electrode 43 of the semiconductor element 40.

The sixth wire W6 connects the fourth element electrode 44 of the semiconductor element 40 to the low-voltage lead 62A. The seventh wire W7 connects the fifth element electrode 45 of the semiconductor element 40 to the low-voltage lead 62B. The eighth wire W8 connects the sixth element electrode 46 of the semiconductor element 40 to the low-voltage lead 63. The ninth wire W9 connects the seventh element electrode 47 of the semiconductor element 40 to the low-voltage lead 65. The tenth wire W10 connects the eighth element electrode 48 of the semiconductor element 40 to the low-voltage lead 66. The eleventh wire W11 connects the ninth element electrode 49 of the semiconductor element 40 to the low-voltage lead 68. In this manner, the high-voltage leads 52 and 53 are electrically connected to the resistive element 20, the resistive element 20 is electrically connected to the semiconductor element 40, and the semiconductor element 40 is electrically connected to the low-voltage leads 62A, 62B, 63, 65, 66, and 68.

As shown in FIG. 2, the encapsulation resin 70 encapsulates the high-voltage die pad 51, the low-voltage die pad 61, the resistive element 20, and the semiconductor element 40. The encapsulation resin 70 also encapsulates the wires W1 to W11.

Figure 3:
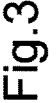
FIG. 3 is an enlarged view of a resistive element and its surrounding area in the semiconductor device of FIG. 2.
Figure 3:
Figure 5:
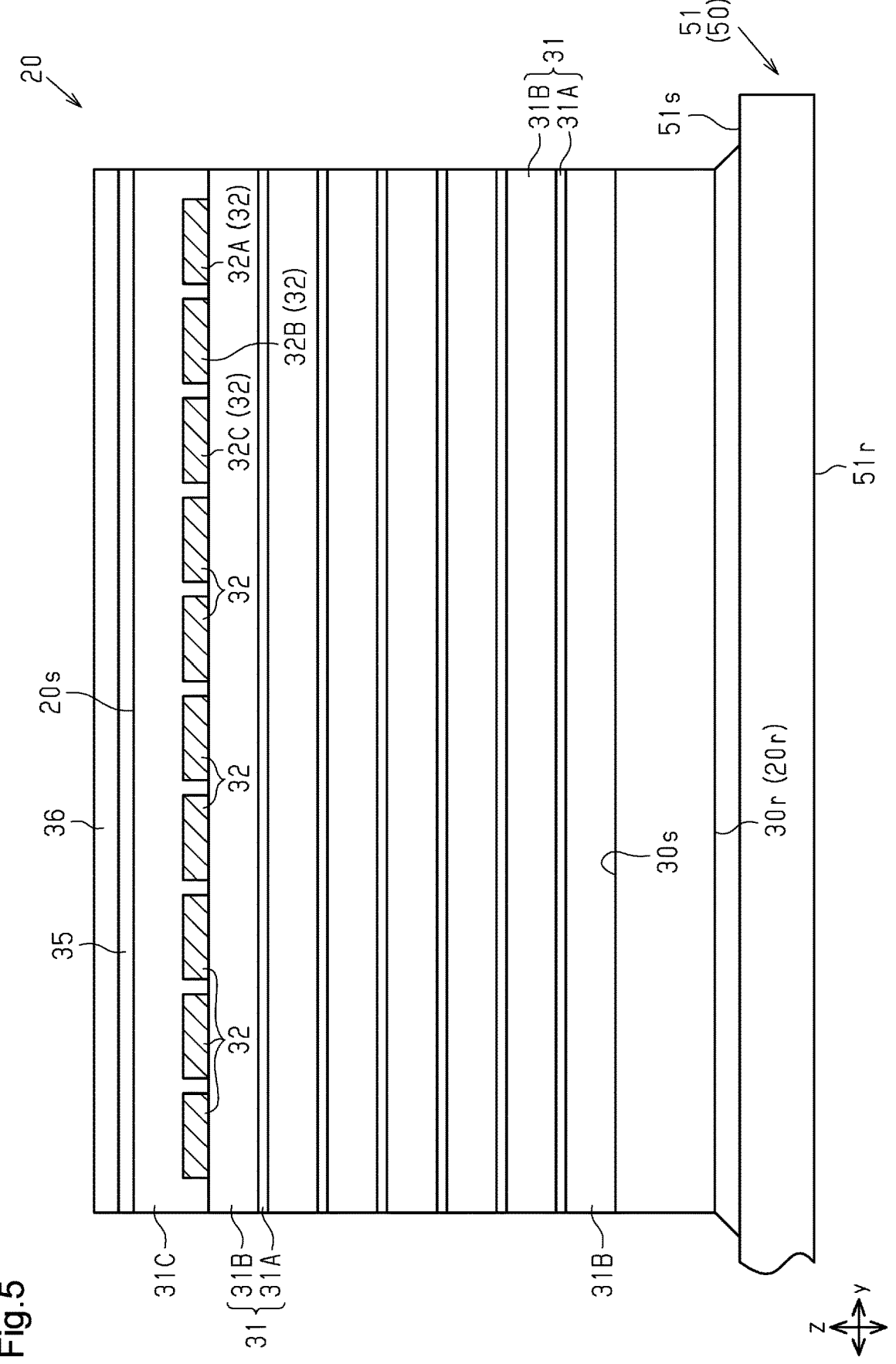
FIG. 5 is a cross-sectional view of the semiconductor device taken along line 5-5 in FIG. 2.

The resistive element 20 will now be described in detail with reference to FIG. 3 to FIG. 4 is a cross-sectional view of the semiconductor device 10 taken along line 4-4 in FIG. 2, and FIG. 5 is a cross-sectional view of the semiconductor device 10 taken along line 5-5 in FIG. 2.

As shown in FIG. 4, the resistive element 20 includes a substrate 30, insulation layers 31 formed on the substrate 30, and the thin-film resistive layers 32 formed on the insulation layers 31.

The substrate 30 is formed by, for example, a semiconductor substrate of which the thickness direction is the z-direction. In one example, the substrate 30 is formed from a material including silicon (Si). In the present embodiment, the substrate 30 is a Si substrate. The substrate 30 includes a substrate main surface 30s and a substrate back surface 30r at opposite sides in the z-direction. The substrate back surface 30r forms the element back surface 20r of the resistive element 20. Thus, the substrate 30 is bonded by the conductive bonding material to the high-voltage die pad 51. The substrate 30 is mounted on the high-voltage die pad 51. As a result, the potential at the substrate 30 is equal to the potential at the high-voltage die pad 51. The z-direction is the thickness direction of the substrate 30.

In the present embodiment, the insulation layers 31 are stacked on the substrate main surface 30s of the substrate 30 in the z-direction. An insulation cover layer 31C is formed on the uppermost one of the insulation layers 31. In the present embodiment, the total thickness T1 of the insulation layers 31 and the insulation cover layer 31C is greater than the thickness T2 of the substrate 30 (T1>T2). The number of the stacked insulation layers 31 is determined in accordance with the dielectric withstand voltage required for the resistive element 20.

Each insulation layer 31 includes a first insulation layer 31A and a second insulation layer 31B formed on the first insulation layer 31A and including silicon oxide ($SiO_2$). The first insulation layer 31A includes, for example, silicon nitride (SiN), silicon carbide (SiC), silicon carbon nitride (SiCN), or the like. In the present embodiment, the first insulation layer 31A includes SiN. The second insulation layer 31B is, for example, an interlayer insulation film. The first insulation layer 31A is thinner than the second insulation layer 31B. The lowermost insulation layer 31, contacting the substrate main surface 30s of the substrate 30, includes only the second insulation layer 31B.

The thin-film resistive layers 32 are formed on the insulation layers 31. More specifically, the thin-film resistive layers 32 are formed on the second insulation layer 31B. The thin-film resistive layers 32 include chromium silicide (CrSi). In the present embodiment, the thickness T3 of the thin-film resistive layers 32 is less than the thickness T4 of the insulation layers 31.

The insulation cover layer 31C covers the thin-film resistive layers 32. The insulation cover layer 31C is formed on the thin-film resistive layers 32. The insulation cover layer 31C is formed from, for example, the same material as the second insulation layer 31B. The thin-film resistive layers 32 are sandwiched by the insulation layers 31 and the insulation cover layer 31C.

When the insulation layers 31 and the insulation cover layer 31C are considered as a single insulator, the thin-film resistive layers 32 are embedded in the insulator. The insulation cover layer 31C forms the uppermost layer of the insulator. The element head surface 20s of the resistive element 20 is the head surface of the insulator, that is, the head surface of the insulation cover layer 31C.

The thickness of the insulation layers 31 is greater than the thickness of the insulation cover layer 31C. Thus, the thin-film resistive layers 32 are located closer to the element head surface 20s of the resistive element 20 than the substrate 30. In other words, the thin-film resistive layers 32 are located at positions that are farther from the substrate 30 than the middle part of the insulator in the thickness direction (z-direction).

As shown in FIGS. 3 and 4, each thin-film resistive layer 32 extends in the x-direction. In other words, each thin-film resistive layer 32 extends in the arrangement direction of the high-voltage die pad 51 and the low-voltage die pad 61 (refer to FIG. 2). Each thin-film resistive layer 32 extends parallel to the direction in which the short sides of the resistive element 20 extend.

Referring to FIG. 3, as viewed in the z-direction, each thin-film resistive layer 32 has the shape of a narrow belt, of which the long sides extend in the x-direction and the short sides extend in the y-direction. As viewed in the z-direction, the thin-film resistive layers 32 are located at the same position in the x-direction and separated from one another in the y-direction. In other words, as viewed in the z-direction, the thin-film resistive layers 32 are disposed separated from one another in a direction orthogonal to the arrangement direction of the high-voltage die pad 51 and the low-voltage die pad 61. As viewed in the z-direction, the thin-film resistive layers 32 are disposed separated from one another in the arrangement direction of the high-voltage leads 52 and 53 (refer to FIG. 2). As viewed in the z-direction, the thin-film resistive layers 32 are disposed separated from one another in the arrangement direction of the low-voltage leads 62A, 62B, and 63 to 68.

In the present embodiment, the thin-film resistive layers 32 are equal in size. That is, the thin-film resistive layers 32 are equal in length in the x-direction, equal in length in the y-direction, and equal in thickness in the z-direction. The thin-film resistive layers 32 are disposed at a constant pitch.

As shown in FIG. 5, the thin-film resistive layers 32 are disposed in a state located at the same position in the z-direction and separated from one another in a direction (y-direction in present embodiment) orthogonal to the z-direction. The thin-film resistive layers 32 are formed on the same one of the insulation layers 31. In the present embodiment, the distance between adjacent ones of the thin-film resistive layers 32 in the y-direction is less than the length of each thin-film resistive layer 32 in the y-direction (width of thin-film resistive layer 32).

The connection between the thin-film resistive layers 32 will now be described in detail.

In the description hereafter, for the sake of convenience, three of the thin-film resistive layers 32 that are arranged next to one another in the y-direction with be referred to as the first thin-film resistive layer 32A, the second thin-film resistive layer 32B, and the third thin-film resistive layer 32C. That is, the thin-film resistive layers 32 includes, the first thin-film resistive layer 32A, the second thin-film resistive layer 32B, and the third thin-film resistive layer 32C. The thin-film resistive layers 32A to 32C are disposed in the y-direction in the order of the first thin-film resistive layer 32A, the second thin-film resistive layer 32B, and the third thin-film resistive layer 32C. As viewed in the z-direction, the first thin-film resistive layer 32A is the one of the thin-film resistive layers 32 located closest to the side surface 51d of the high-voltage die pad 51. Further, the first thin-film resistive layer 32A, the second thin-film resistive layer 32B, and the third thin-film resistive layer 32C each include a first end 32P and a second end 32Q. The first end 32P and the second end 32Q form the two ends of each of the thin-film resistive layers 32A to 32C in the x-direction. The first end 32P is the end of each of the thin-film resistive layers 32A to 32C that is near the low-voltage die pad 61 (refer to FIG. 2), and the second end 32Q is the end of each of the thin-film resistive layers 32A to 32C that is far from the low-voltage die pad 61.

As shown in FIG. 3, with the first thin-film resistive layer 32A and the second thin-film resistive layer 32B, the first ends 32P of the two thin-film resistive layers 32A and 32B are connected to each other. More specifically, a connection line 33 connects the first end 32P of the first thin-film resistive layer 32A and the first end 32P of the second thin-film resistive layer 32B. The connection line 33 extends in the y-direction. As viewed in the z-direction, the connection line 33 is disposed overlapping the first end 32P of the first thin-film resistive layer 32A and the first end 32P of the second thin-film resistive layer 32B.

With the second thin-film resistive layer 32B and the third thin-film resistive layer 32C, the second ends 32Q of the two thin-film resistive layers 32B and 32C are connected to each other. More specifically, a connection line 33 connects the second end 32Q of the second thin-film resistive layer 32B and the second end 32Q of the third thin-film resistive layer 32C. The connection line 33 extends in the y-direction. As viewed in the z-direction, the connection line 33 is disposed overlapping the second end 32Q of the second thin-film resistive layer 32B and the second end 32Q of the third thin-film resistive layer 32C. The thin-film resistive layers 32 other than he thin-film resistive layers 32A to 32C are connected in the same manner as the thin-film resistive layers 32A to 32C.

Referring to FIG. 3, as viewed in the z-direction, the electrodes 21 to 25 of the resistive element 20 are disposed at positions overlapping the thin-film resistive layers 32.

In further detail, as viewed in the z-direction, the first input electrode 21 is disposed at a position overlapping the one of the thin-film resistive layers 32 (first thin-film resistive layer 32A) that is the closest to the high-voltage lead 52. In the present embodiment, as viewed in the z-direction, the first input electrode 21 is disposed at a position overlapping the second end 32Q of this thin-film resistive layer 32. The first input electrode 21 is electrically connected to this thin-film resistive layer 32 (first thin-film resistive layer 32A).

As viewed in the z-direction, the second input electrode 22 is disposed at a position overlapping the one of the thin-film resistive layers 32 that is the closest to the high-voltage lead 53. In the present embodiment, as viewed in the z-direction, the second input electrode 22 is disposed at a position overlapping the one of the two ends of the thin-film resistive layer 32 in the x-direction (second end 32Q) that is farther from the low-voltage die pad 61. The second input electrode 22 is electrically connected to this thin-film resistive layer 32.

In this manner, the first input electrode 21 is electrically connected to one of the two ends of the thin-film resistive layers 32 that are connected in series, and the second input electrode 22 is electrically connected to the other one of the two ends. That is, the thin-film resistive layers 32 are electrically connected in series between the first input electrode 21 and the second input electrode 22.

As viewed in the z-direction, the reference electrode 23 is disposed at a position overlapping a substantially middle one of the thin-film resistive layers 32 in the y-direction. In the present embodiment, as viewed in the z-direction, the reference electrode 23 is disposed at a position overlapping the one of the two ends of the substantially middle thin-film resistive layer 32 in the x-direction that is closer to the low-voltage die pad 61. The reference electrode 23 is electrically connected to the substantially middle thin-film resistive layer 32.

As viewed in the z-direction, the first detection electrode 24 is disposed at a position overlapping a predetermined one of the thin-film resistive layers 32 located between the middle thin-film resistive layer 32 and the first thin-film resistive layer 32A in the y-direction. In the present embodiment, as viewed in the z-direction, the first detection electrode 24 is disposed at a position overlapping the one of the two ends of this thin-film resistive layer 32 in the x-direction that is closer to the low-voltage die pad 61. The first detection electrode 24 is electrically connected to this predetermined thin-film resistive layer 32.

As viewed in the z-direction, the second detection electrode 25 is disposed at a position overlapping a predetermined one of the thin-film resistive layers 32 located between the middle thin-film resistive layer 32 and the one of the thin-film resistive layers 32 that is the closest to the high-voltage lead 53. In the present embodiment, as viewed in the z-direction, the second detection electrode 25 is disposed at a position overlapping the one of the two ends of this thin-film resistive layer 32 in the x-direction that is closer to the low-voltage die pad 61. The second detection electrode 25 is electrically connected to this predetermined thin-film resistive layer 32.

As shown in FIG. 4, the first input electrode 21 is formed on the insulation cover layer 31C. Thus, the first input electrode 21 is formed at a position separated in the z-direction from the thin-film resistive layers 32. The first input electrode 21 is located farther from the substrate 30 than the thin-film resistive layers 32. The first input electrode 21 and the thin-film resistive layers 32 are connected by a connection line 34. Although not shown in the drawings, the electrodes 22 to 25 are formed on the insulation cover layer 31C in the same manner as the first input electrode 21. The electrodes 22 to 25 and the thin-film resistive layers 32, electrically connected to the electrodes 22 to 25, are respectively connected by connection lines 34. As viewed in the z-direction, the electrodes 21 to 25 are disposed at positions overlapping the corresponding thin-film resistive layers 32. Thus, the connection lines 34 extend in the z-direction. The connection lines 34 are through-lines extending through the insulation cover layer 31C in its thickness direction (z-direction).

As shown in FIGS. 4 and 5, the resistive element 20 further includes a protective film formed on the insulation cover layer 31C and a passivation film 36 formed on the protective film 35. The protective film 35 partially covers each of the electrodes 21 to 25. The protective film 35 protects the insulation layer 31 and the insulation cover layer 31C and includes, for example, a SiO$_2$ film. The passivation film 36 is a surface protection film of the resistive element 20 and includes, for example, a SiN film. The protective film 35 and the passivation film 36 protect the element head surface 20s of the resistive element 20.

Operation

The operation of the semiconductor device 10 will now be described.

Figure 6:
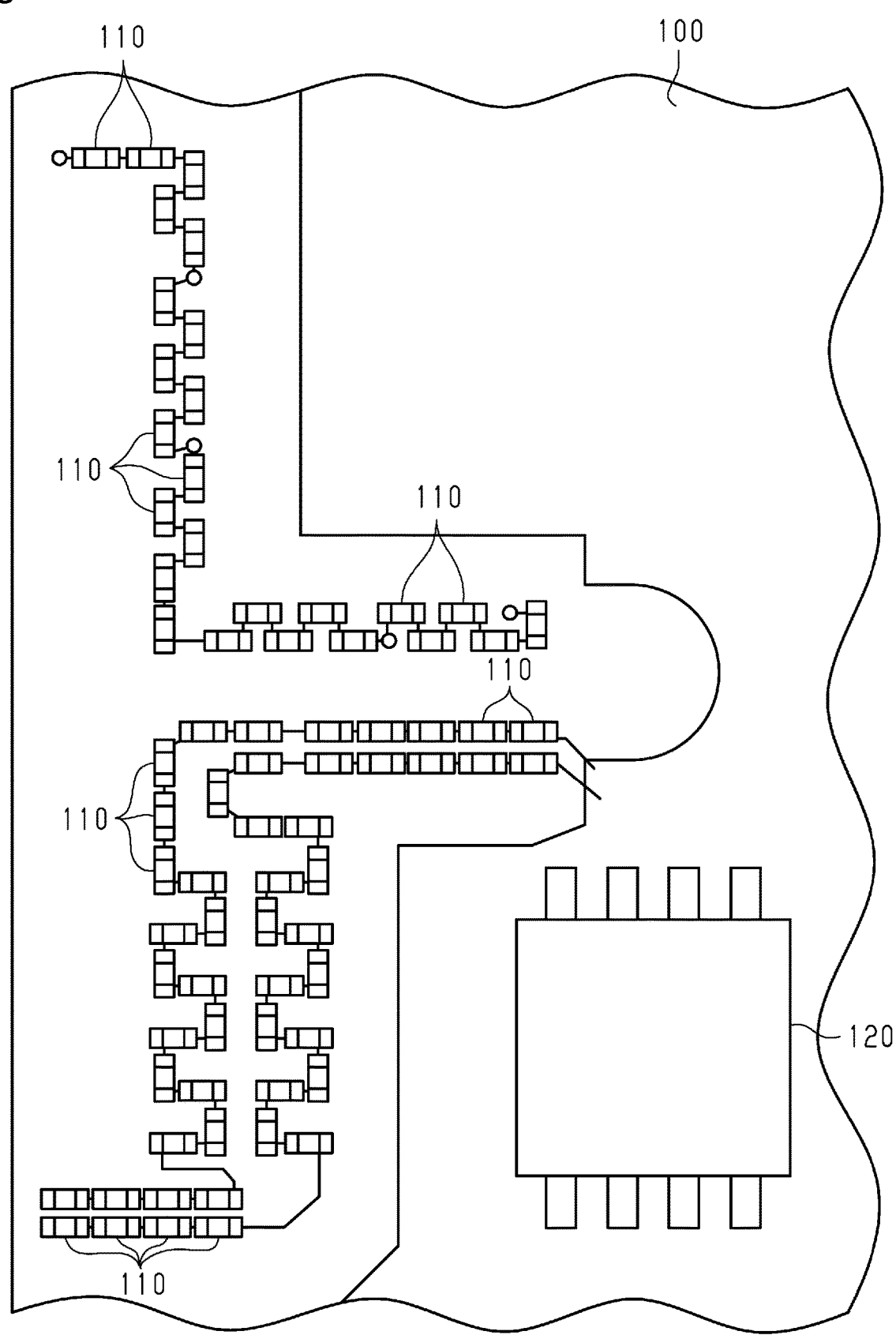
FIG. 6 is a plan view of a high-voltage monitor in a comparative example.

FIG. 6 is a plan view showing one example of part of a high-voltage monitor in a comparative example. The high-voltage monitor of the comparative example includes discrete resistors 110 and a semiconductor element 120 that are mounted on a circuit board 100. The resistors 110 are electrically connected in series to one another in order to divide voltages. The resistors 110 are formed as separate packages. Thus, the resistors 110 need to be disposed on the circuit board 100 in a state separated from one another. This increases the space occupied by the resistors 110 as shown in FIG. 6. In addition, the resistors 110 and the semiconductor element 120 are formed as separate packages. Thus, lines connecting the resistors 110 and the semiconductor element 120 are formed on the circuit board 100. Further, the resistors 110 need to be separated from the semiconductor element 120 to allow the lines to be laid out. This enlarges the high-voltage monitor of the comparative example.

In this respect, in the present embodiment, the resistive element 20 is constructed as a single chip including the thin-film resistive layers 32. Thus, the spaced occupied is less than a structure in which the resistors 110 are disposed on the circuit board 100. In addition, the semiconductor element 40 and the resistive element 20 are included in the same package. Thus, the distance between the semiconductor element 40 and the resistive element 20 is less than the distance between the resistors 110 and the semiconductor element 120.

Advantages

The semiconductor device 10 of the present embodiment has the advantages described below.

(1) The semiconductor device 10 includes the high-voltage die pad 51 and the low-voltage die pad 61, which are insulated from each other, the resistive element 20, which is mounted on the high-voltage die pad 51, and the semiconductor element 40, which is mounted on the low-voltage die pad 61. The resistive element 20 includes the substrate 30, which is mounted on the high-voltage die pad 51, the insulation layers 31, which are formed on the substrate 30, and the thin-film resistive layers 32, which are formed on the insulation layers 31.

With this structure, the semiconductor device 10 includes the resistive element 20 and the semiconductor element 40. Thus, the resistive element 20 can be disposed closer to the semiconductor element 40 than when the resistive element 20 is separate from the semiconductor device 10. The space occupied by the semiconductor device 10 on the circuit board can be reduced in size.

(2) A conductive bonding material electrically connects the substrate 30 and the high-voltage die pad 51. Thus, the dielectric withstand voltage of the resistive element 20 is mainly determined by the distance in the z-direction between the substrate main surface 30s of the substrate 30 and each of the electrodes 21 to 25.

In this respect, in the present embodiment, the insulation layers 31 are stacked in the thickness direction (z-direction) of the substrate 30 in the thickness direction. This allows the distance from the substrate main surface 30s of the substrate 30 to each of the electrodes 21 to 25 to be increased in the z-direction. Thus, the dielectric withstand voltage is easily imparted to the resistive element 20.

(3) Each insulation layer 31 includes the first insulation layer 31A, which includes SiN, SiC, or SiCN, and the second insulation layer 31B, which is formed on the first insulation layer 31A and includes SiO$_2$.

With this structure, when the insulation layers 31 are stacked, the first insulation layer 31A is arranged between adjacent ones of the second insulation layer 31B. This limits warping of the insulation layer 31.

(4) The resistive element 20 includes the first input electrode 21 and the second input electrode 22. The thin-film resistive layers 32 are electrically connected in series between the first input electrode 21 and the second input electrode 22.

With this structure, the resistive element 20 occupies less space than when discrete resistors are electrically connected in series to one another.

In addition, when discrete resistors are electrically connected in series, the resistance differs greatly between resistors making it difficult to obtain a resistance ratio with high precision. In the present embodiment, the resistive element 20 includes the thin-film resistive layers 32 that are arranged in parallel to form a resistance. Thus, differences in the resistance is decreased between the thin-film resistive layers 32 allowing a reference ratio to be obtained with high precision.

(5) The thin-film resistive layers 32 are disposed in a state located at the same position in the thickness direction (z-direction) of the substrate 30 and separated from one another in a direction (y-direction) orthogonal to the thickness direction of the substrate 30.

With this structure, the thin-film resistive layers 32 are formed on the same insulation layer 31 (same second insulation layer 31B) so that the thin-film resistive layers 32 are located at the same position in the z-direction. This allows the thin-film resistive layers 32 to be formed in the same process and facilitates manufacture of the resistive element 20.

(6) The resistive element 20, which is rectangular and has long sides and short sides as viewed in the thickness direction of the substrate 30 (z-direction), is mounted on the high-voltage die pad 51 so that the short sides extend in the first direction (x-direction), which is the arrangement direction of the high-voltage die pad 51 and the low-voltage die pad 61. The thin-film resistive layers 32 extend in the x-direction. The thin-film resistive layers 32 are disposed separated from one another in the second direction (y-direction) that is orthogonal to the first direction (x-direction) as viewed in the thickness direction of the substrate 30 (z-direction).

With this structure, the short sides of the resistive element 20 extend in the arrangement direction of the high-voltage die pad 51 and the low-voltage die pad 61. This allows the semiconductor device 10 to be reduced in size.

In addition, the thin-film resistive layers 32 are disposed separated from one another along the long sides of the resistive element 20. Thus, the thin-film resistive layers 32 can be increased in number. This facilitates adjustment of the resistance ratio of the resistive element 20.

(7) The resistive element 20 includes the electrodes 21 to 25. The electrodes 21 to are disposed at positions overlapping the thin-film resistive layers 32 as viewed in the thickness direction (z-direction) of the substrate 30.

With this structure, the distance from the electrodes 21 to 25 to the overlapping thin-film resistive layers 32 can be shortened. This allows the connection lines 34, which connect the electrodes 21 to 25 to the thin-film resistive layers 32, to extend through the insulation cover layer 31C and simplifies the structure of the connection lines 34.

(8) The high-voltage leads 52 and 53 are disposed at the two ends of the high-voltage die pad 51 in the y-direction. The high-voltage lead 52 is disposed separated from the high-voltage die pad 51, and the high-voltage lead 53 is integrated with the high-voltage die pad 51. The resistive element 20 is disposed on the high-voltage die pad 51 toward the high-voltage lead 53 in the y-direction.

With this structure, during the manufacturing process of the semiconductor device the high-voltage die pad 51 is supported by the high-voltage lead 53. Thus, by disposing the resistive element 20 on the high-voltage die pad 51 toward the high-voltage lead 53, the high-voltage die pad 51 will not incline in the z-direction when mounting the resistive element 20 on the high-voltage die pad 51.

(9) The high-voltage leads 52 and 53 are insulated from each other, and the high-voltage leads 52 and 53 are less in number than the low-voltage leads 62A, 62B, and 63 to 68.

With this structure, the high-voltage leads 52 and 53 can be spaced apart greatly so that a creepage distance is easily obtained between the high-voltage lead 52 and the high-voltage lead 53.

(10) The thin-film resistive layers 32 include CrSi.

With this structure, the thin-film resistive layers 32 can be formed on the second insulation layer 31B that includes SiO$_2$.

(11) The semiconductor device 10 includes the encapsulation resin 70 encapsulating the high-voltage die pad 51, the low-voltage die pad 61, the resistive element 20, and the semiconductor element 40. The encapsulation resin 70 also encapsulates the wires W1 to W11.

This structure protects the high-voltage die pad 51, the low-voltage die pad 61, the resistive element 20, the semiconductor element 40, and the wires W1 to W11. Further, relative movement is restricted between the high-voltage die pad 51 and the low-voltage die pad 61. This avoids the application of excess load to the wires W1 to W11.

(12) The thin-film resistive layers 32 are disposed on the insulator, including the insulation layers 31 and the insulation cover layer 31C, closer to the element head surface 20s of the resistive element 20 than the middle part of the insulator in the thickness direction (z-direction).

With this structure, the thin-film resistive layers 32 are disposed at positions farther from the substrate 30 than the middle part of the insulator in the thickness direction. Thus, the distance can be increased between the substrate 30 and the thin-film resistive layers 32. This improves the dielectric withstand voltage of the thin-film resistive layers 32 and the substrate 30.

Modified Examples

The embodiment described above exemplifies, without any intention to limit, applicable forms of a semiconductor device according to this disclosure. The semiconductor device in accordance with this disclosure may be modified from the embodiment described above. For example, the configuration in the above embodiment may be replaced, changed, or omitted in part or include an additional element. The modified examples described below may be combined as long as there is no technical contradiction. In the modified examples described hereafter, same reference characters are given to those components that are the same as the corresponding components of the above embodiments. Such components will not be described in detail.

In the above embodiment, there may be any number of high-voltage leads. In one example, there may be three or more leads.

In the above embodiment, there may be any number of low-voltage leads. In one example, there may be seven or less low-voltage leads. Alternatively, there may be nine or more low-voltage leads. Further, the low-voltage leads may be less than or equal in number to the high-voltage leads.

In the above embodiment, the high-voltage leads 52 and 53 extend in the x-direction from the inside to the outside of the encapsulation resin 70 but instead may extend in the y-direction from the inside to the outside of the encapsulation resin 70. In this case, the high-voltage leads 52 and 53 are separated from one another in the x-direction. Thus, the arrangement direction of the high-voltage leads 52 and 53 will coincide with the arrangement direction of the high-voltage die pad 51 and the low-voltage die pad 61.

In the above embodiment, the low-voltage leads 62A, 62B, and 63 to 68 extend in the x-direction from the inside to the outside of the encapsulation resin 70 but instead may extend in the y-direction from the inside to the outside of the encapsulation resin 70. In this case, the low-voltage leads 62A, 62B, and 63 to 68 are separated from one another in the x-direction. Thus, the arrangement direction of the low-voltage leads 62A, 62B, and 63 to 68 will coincide with the arrangement direction of the high-voltage die pad 51 and the low-voltage die pad 61.

In the above embodiment, the substrate 30 does not have to be a Si substrate. In one example, the substrate 30 may be a semiconductor substrate formed from a semiconductor material other than Si. Further, instead of a semiconductor substrate, the substrate 30 may be an electrically insulative glass substrate or a silicon on insulator (SOI) substrate.

Figure 7:
FIG. 7 is a cross-sectional view of a resistive element in a semiconductor device of a modified example.
Figure 7:

In the above embodiment, the thin-film resistive layers 32 are disposed in a single line in the y-direction in a state located at the same position in the z-direction. This is, however, not a limitation. For example, the thin-film resistive layers 32 may be separated from one another in the y-direction and stacked in the z-direction. In one example, as shown in FIG. 7, pairs of the thin-film resistive layers 32, with one arranged above the other in the z-direction, may be disposed separated from one another in the y-direction. Thus, the thin-film resistive layers 32 may be arranged separated from each other in the z-direction. Further, one or more insulation cover layers 31C may be disposed between the separated thin-film resistive layers 32 in the z-direction.

With this structure, as long as the resistance of the resistive element 20 is the same, less thin-film resistive layers 32 may be disposed in the y-direction. This allows the resistive element 20 to be reduced in size as viewed in the z-direction. Instead of two thin-film resistive layers 32, three or more may be stacked.

Figure 8:
FIG. 8 is an enlarged view of a resistive element and its surrounding area in a semiconductor device of a modified example.
Figure 8:

In the above embodiment, the thin-film resistive layers 32 are disposed extending in the x-direction and separated from one another in the y-direction. This, however, is not a limitation. For example, as shown in FIG. 8, the thin-film resistive layers 32 may extend in the y-direction. In this case, the thin-film resistive layers 32 are disposed separated from one another in the x-direction in a state located at the same position in the y-direction. The thin-film resistive layers 32 are separated from one another in the arrangement direction of the high-voltage die pad 51 and the low-voltage die pad 61. In other words, as viewed in the z-direction, the thin-film resistive layers 32 may extend in a direction parallel to the long sides of the resistive element 20 and be separated from one another in a direction parallel to the short sides of the resistive element 20.

In the above embodiment, the thin-film resistive layers 32 are equal in length in the x-direction. This, however, is not a limitation. At least one of the thin-film resistive layers 32 may have a length in the x-direction that differs from the length in the x-direction of the other thin-film resistive layers 32.

In the above embodiment, the thin-film resistive layers 32 are equal in length in the y-direction. This, however, is not a limitation. At least one of the thin-film resistive layers 32 may have a length in the y-direction that differs from the length in the y-direction of the other thin-film resistive layers 32.

In the above embodiment, the length in the y-direction of each thin-film resistive layer 32 may have any relationship with the length in the y-direction of each of the electrodes 21 to 25. In one example, the length in the y-direction of each thin-film resistive layer 32 may be less than or equal to the length in the y-direction of each of the electrodes 21 to 25. In this case, for example, as viewed in the z-direction, in a case where the connection line 34 overlaps the first input electrode 21 and both of the first thin-film resistive layer 32A and the second thin-film resistive layer 32B, the connection line 34 is disposed only at a position where the first input electrode 21 overlaps the first thin-film resistive layer 32A. In the same manner, with the other electrodes 22 to 25, the connection line 34 is disposed only at positions where the other electrodes 22 to 25 overlap the connected thin-film resistive layers 32.

Figure 9:
FIG. 9 is an enlarged view of a resistive element and its surrounding area in a semiconductor device of a modified example.

The above embodiment includes a plurality of the thin-film resistive layers 32. This, however, is not a limitation. In one example, as shown in FIG. 9, a single thin-film resistive layer 32 may extend in a serpentine manner. More specifically, the thin-film resistive layer 32 may include first resistive layers 32a, extending in the x-direction, and second resistive layers 32b connecting adjacent ones of the first resistive layers 32a in the y-direction. The second resistive layers 32b connects the two x-direction ends of the first resistive layers 32a in the y-direction. This structure eliminates the need for the connection lines 33 and simplifies the structure of the resistive element 20.

Figure 10:
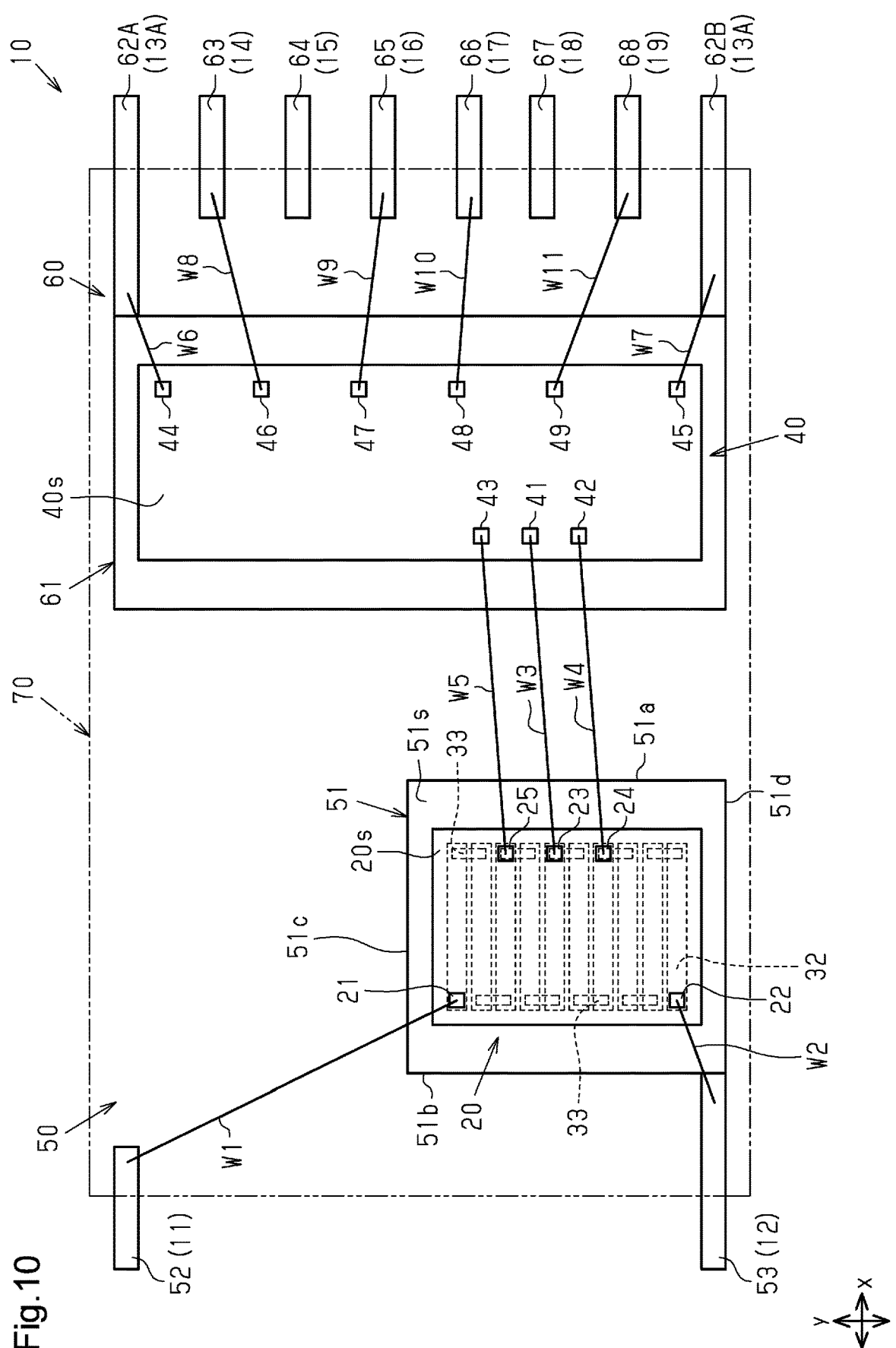
FIG. 10 is a plan view showing the internal structure of a semiconductor device of a modified example.

In the above embodiment, the length of the high-voltage die pad 51 in the y-direction may be freely changed. In one example, as shown in FIG. 10, the high-voltage die pad 51 is shorter in length in the y-direction than the high-voltage die pad 51 of the above embodiment. As viewed in the z-direction, the distance between the side surface 51*d* of the high-voltage die pad 51 and the resistive element 20 is shorter than the distance between the side surface 51*d* of the high-voltage die pad 51 and the resistive element 20 in the above embodiment (refer to FIG. 2). Thus, the distance between the high-voltage die pad 51 and the high-voltage lead 52 is longer than the distance between the high-voltage die pad 51 and the high-voltage lead 52 in the above embodiment. With this structure, the dielectric withstand voltage required for the high-voltage die pad 51 and the high-voltage lead 52 can be easily obtained.

In the above embodiment, as viewed in the z-direction, the electrodes 21 to 25 are disposed at positions overlapping the thin-film resistive layers 32. This, however, is not a limitation. As viewed in the z-direction, at least one of the electrodes 21 to 25 can be disposed at a position separated from the thin-film resistive layers 32.

In the above embodiment, the resistive element 20 and the semiconductor element 40 are connected by three wires, the third to fifth wires W3 to W5. This, however, is not a limitation. For example, the resistive element 20 and the semiconductor element 40 may be connected by four or more wires. Alternatively, the elements may be connected by one wire or two wires.

In the above embodiment, the insulation layer 31 includes the second insulation layer 31B, including $SiO_2$, on the first insulation layer 31A, including SiN, SiC, or SiCN. This, however, is not a limitation. For example, the insulation layer 31 may include only the second insulation layer 31B.

In the above embodiment, the encapsulation resin 70 may be omitted from the semiconductor device 10.

In the above embodiment, the stacked number of the insulation layers 31 may be freely changed. In one example, there may be only one insulation layer 31.

In the above embodiment, the semiconductor device 10 is a high-voltage monitor but instead may have another functionality. In one example, the semiconductor device 10 may be a current monitor or a gate driver. The semiconductor device 10 only needs to include a resistive element and a semiconductor element.

In this specification, the word "on" includes the meaning of "above" in addition to the meaning of "on" unless otherwise described in the context. Accordingly, the phrase of "A formed on B" means that A contacts B and is directly disposed on B and may also mean, as a modified example, that A is disposed above B without contacting B. Thus, the word "on" will also allow for a structure in which another member is formed between A and B.

The z-axis direction referred to in this specification does not necessarily have to be the vertical direction and does not necessarily have to fully coincide with the vertical direction. Accordingly, in the structures of the present disclosure, up and down in the z-axis direction as referred to in this specification is not limited to up and down in the vertical direction. For example, the x-axis direction may be the vertical direction. Alternatively, the y-axis direction may be the vertical direction.

REFERENCE SIGNS LIST

10) semiconductor device
11) input terminal (first input terminal)
12) input terminal (second input terminal)
13A, 13B, 14 to 19) output terminal
20) resistive element
21) first input electrode (electrodes)
22) second input electrode (electrodes)
23) reference electrode (electrodes)

US 12,666,630 B2

17

24) first detection electrode (electrodes)
25) second detection electrode (electrodes)
30) substrate
31) insulation layer
31A) first insulation layer
31B) second insulation layer
32) thin-film resistive layer
32A) first thin-film resistive layer
32B) second thin-film resistive layer
32C) third thin-film resistive layer
32P) first end
32Q) second end
40) semiconductor element
41) first element electrode
42) second element electrode
43) third element electrode
50) high-voltage lead frame
51) high-voltage die pad (first conductive layer)
52) high-voltage lead (first input terminal)
53) high-voltage lead (second input terminal)
60) low-voltage lead frame
61) low-voltage die pad (second conductive layer)
62A, 62B, 63 to 68) low-voltage lead (output terminal)
70) encapsulation resin
W1) first wire
W2) second wire
W3) third wire
W4) fourth wire
W5) fifth wire

The invention claimed is:

1. A semiconductor device, comprising:
a first conductive layer and a second conductive layer that are insulated from each other;
a resistive element mounted on the first conductive layer; and
a semiconductor element mounted on the second conductive layer,
wherein the resistive element includes:
a substrate mounted on the first conductive layer;
an insulation layer formed on the substrate;
a thin film resistive layer formed on the insulation layer;
a head surface; and
electrodes formed on the head surface,
wherein the electrodes are formed on the head surface separated from each other and electrically connected to the thin film resistive layer.

2. The semiconductor device according to claim 1, wherein insulation layers are stacked in a thickness direction of the substrate.

3. The semiconductor device according to claim 2, wherein each of the insulation layers includes a first insulation layer including SiN, SiC, or SiCN and a second insulation layer formed on the first insulation layer and including $SiO_2$.

4. The semiconductor device according to claim 3, wherein the thin film resistive layer is formed on the second insulation layer.

5. The semiconductor device according to claim 1, wherein the electrodes are disposed at positions overlapping the thin film resistive layer as viewed in a thickness direction of the substrate.

6. The semiconductor device according to claim 1, wherein:
the electrodes include a first input electrode and a second input electrode;
thin film resistive layers are arranged; and

the thin film resistive layers are electrically connected in series between the first input electrode and the second input electrode.

7. The semiconductor device according to claim 6, wherein the thin film resistive layers are disposed separated from each other in a direction orthogonal to a thickness direction of the substrate in a state located at the same position in the thickness direction of the substrate.

8. The semiconductor device according to claim 7, wherein:
the resistive element is rectangular, includes a long side and a short side as viewed in the thickness direction of the substrate, and is mounted on the first conductive layer so that the short side extends in a first direction that is an arrangement direction of the first conductive layer and the second conductive layer;
the thin film resistive layers extend in the first direction; and
the thin film resistive layers are disposed separated from each other in a second direction that is orthogonal to the first direction as viewed in the thickness direction of the substrate.

9. The semiconductor device according to claim 8, wherein:
the thin film resistive layers include a first thin film resistive layer, a second thin film resistive layer, and a third film resistive layer that are adjacent to one another in the second direction;
the first thin film resistive layer, the second thin film resistive layer, and the third film resistive layer each include two ends in the first direction, the end closer to the second conductive layer being a first end, and the end farther from the second conductive layer being a second end;
the first end of the first thin film resistive layer is electrically connected to the first end of the second thin film resistive layer; and
the second end of the second thin film resistive layer is electrically connected to the second end of the third thin film resistive layer.

10. The semiconductor device according to claim 6, wherein the thin film resistive layers are disposed separated from each other in a thickness direction of the substrate.

11. The semiconductor device according to claim 6, comprising:
a first input terminal and a second input terminal;
a first wire connecting the first input electrode and the first input terminal; and
a second wire connecting the second input electrode and the second input terminal.

12. The semiconductor device according to claim 11, wherein:
an arrangement direction of the first conductive layer and the second conductive layer as viewed in a thickness direction of the substrate is defined as a first direction, and a direction orthogonal to the first direction is defined as a second direction;
the first input terminal and the second input terminal are disposed at two ends of the first conductive layer in the second direction;
the first input terminal is disposed separated from the first conductive layer;
the second input terminal is integrated with the first conductive layer; and
the resistive element is disposed on the first conductive layer toward the second input terminal in the second direction.

13. The semiconductor device according to claim 11, wherein:

an arrangement direction of the first conductive layer and the second conductive layer as viewed in a thickness direction of the substrate is defined as a first direction, and a direction orthogonal to the first direction is defined as a second direction; and the first input terminal is insulated from the second input terminal in the second direction.

14. The semiconductor device according to claim 11, further comprising three or more output terminals electrically connected to the semiconductor element.

15. The semiconductor device according to claim 11, wherein:

the resistive element includes a reference electrode that outputs divisional voltage from the resistive element, a first detection electrode, and a second detection; and the semiconductor element includes a first element electrode, a second element electrode, and a third element electrode, the semiconductor device further comprising:

a third wire connecting the reference electrode to the first element electrode;

a fourth wire connecting the first detection electrode to the second element electrode; and a fifth wire connecting the second detection electrode to the third element electrode.

16. The semiconductor device according to claim 1, wherein the thin film resistive layer includes CrSi.

17. The semiconductor device according to claim 1, wherein the first conducive layer differs in area from the second conductive layer as viewed in a thickness direction of the substrate.

18. The semiconductor device according to claim 1, further comprising an encapsulation resin that encapsulates the first conductive layer, the second conductive layer, the resistive element, and the semiconductor element.

\* \* \* \* \*